United States Patent
Rajwade et al.

(10) Patent No.: US 9,852,065 B1
(45) Date of Patent: Dec. 26, 2017

(54) METHOD AND APPARATUS FOR REDUCING DATA PROGRAM COMPLETION OVERHEAD IN NAND FLASH

(71) Applicant: Intel Corporation, Santa Clara, CA (US)

(72) Inventors: Shantanu R. Rajwade, Sunnyvale, CA (US); Andrea D'alessandro, Avezzano (IT); Pranav Kalavade, San Jose, CA (US); Violante Moschiano, Avezzano (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/195,328

(22) Filed: Jun. 28, 2016

(51) Int. Cl.
*G11C 16/04* (2006.01)
*G06F 12/02* (2006.01)
*G11C 16/10* (2006.01)
*G11C 16/26* (2006.01)
*G06F 11/07* (2006.01)

(52) U.S. Cl.
CPC ........ *G06F 12/0246* (2013.01); *G06F 11/073* (2013.01); *G06F 11/076* (2013.01); *G11C 16/0483* (2013.01); *G11C 16/10* (2013.01); *G11C 16/26* (2013.01); *G06F 2212/2022* (2013.01)

(58) Field of Classification Search
CPC . G11C 16/0483; G11C 16/10; G11C 16/3418; G11C 29/42; G11C 29/44; G11C 29/4401; G11C 29/52; G11C 29/76; G06F 2212/7207; G06F 2212/7208; G06F 12/0246
USPC .... 365/201, 185.09, 185.17, 185.19, 185.22, 365/185.29, 189.16
See application file for complete search history.

(56) References Cited

U.S. PATENT DOCUMENTS

| | | | | |
|---|---|---|---|---|
| 9,223,656 | B2 * | 12/2015 | Kim | G06F 11/1402 |
| 9,229,854 | B1 * | 1/2016 | Kuzmin | G06F 12/0246 |
| 9,460,799 | B1 * | 10/2016 | Costa | G11C 16/16 |
| 2014/0215129 | A1 * | 7/2014 | Kuzmin | G06F 12/0246 711/103 |
| 2017/0186497 | A1 | 6/2017 | Rajwade et al. | |

* cited by examiner

*Primary Examiner* — Gene Auduong
(74) *Attorney, Agent, or Firm* — Patent Capital Group

(57) ABSTRACT

In one embodiment, an apparatus comprises a storage device comprising a NAND flash memory. The storage device is to receive a write request from a computing host, the write request to specify data to be written to the NAND flash memory; perform a number of program loops to program the data into a plurality of cells of the NAND flash memory, wherein a program loop comprises application of a program voltage to a wordline of the memory to change the threshold voltage of at least one cell of the plurality of cells; and wherein the number of program loops is to be determined prior to receipt of the write request and based on a distribution of threshold voltages of the cells or determined based on tracking a number of program errors for only a portion of the plurality of cells.

20 Claims, 7 Drawing Sheets

METHOD AND APPARATUS FOR REDUCING DATA PROGRAM COMPLETION OVERHEAD IN NAND FLASH

FIELD

The present disclosure relates in general to the field of computer development, and more specifically, to NAND flash memory.

BACKGROUND

A computer system may include one or more central processing units (CPUs) coupled to one or more storage devices. A CPU may include a processor to execute an operating system and other software applications that utilize the storage devices coupled to the CPU. The software applications may write data to the storage devices. The data may be stored by the storage devices in a plurality of memory cells (e.g., NAND flash memory cells) of the storage devices.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include a microcontroller, a digital signal processor (DSP), a system on a chip, network computers (NetPC), set-top boxes, network hubs, wide area network (WAN) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

Figure 1:
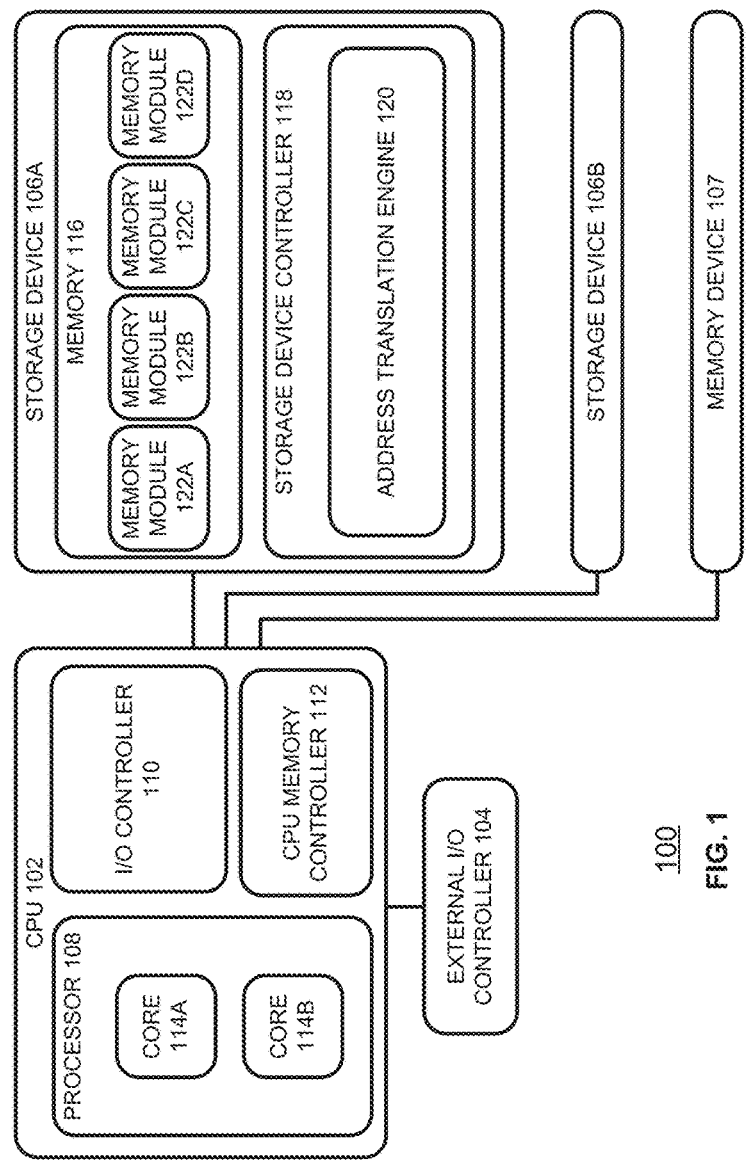
FIG. 1 illustrates a block diagram of components of a computer system in accordance with certain embodiments.

FIG. 1 illustrates a block diagram of components of a computer system 100 in accordance with certain embodiments. System 100 includes a central processing unit (CPU) 102 coupled to an external input/output (I/O) controller 104, a plurality of storage devices 106, and memory device 107. During operation, data may be transferred between storage devices 106 or memory device 107 and the CPU 102. In various embodiments, particular data operations involving a storage device 106 or memory device 107 may be managed by an operating system or other software application executed by processor 108.

In various embodiments, a storage device 106 comprises NAND flash memory. In some embodiments, storage device 106 may be a solid state drive; a memory card; a Universal Serial Bus (USB) flash drive; or memory integrated within a device such as a smartphone, camera, media player, or other computing device. In general, storage devices with NAND flash memory are classified by the number of bits stored by each cell of the memory. For example, a single-level cell (SLC) memory has cells that each store one bit of data, a multi-level cell (MLC) memory has cells that each store two bits of data, a tri-level cell (TLC) memory has cells that each store three bits of data, and a quad-level cell (QLC) memory has cells that each store four bits of data, though some memories may utilize multiple encoding schemes (e.g., MLC and TLC) on the same array.

A program (i.e., write) sequence for a NAND flash memory generally includes numerous program loops to program cells or blocks of memory. As non-limiting examples, MLC encoding may involve roughly 10 program loops, TLC encoding may involve roughly 25 program loops, and QLC encoding may involve around 50 program loops. A program loop generally includes application of a program voltage (e.g., a pulse) followed by one or more program verify voltages (e.g., pulses). The program pulse voltage may be stepped higher in every subsequent program loop to allow or assist slower to program cells to reach their respective target voltage levels. Cells reaching their respective target levels (as determined during the verification pulses) are inhibited in all subsequent program pulses such that they may maintain their programmed threshold voltages. Program loops may continue to be performed until all cells being programmed reach their target threshold voltage. However, most memories allow a certain small fraction of cells to be left behind (i.e., these cells will be inhibited despite not having reached the proper threshold voltage level). The number of such cells may be defined by a threshold (e.g., a count fail byte (CFBYTE)), which may indicate the number of cells per program level that are allowed to fail (program levels are described in more detail below in connection with FIG. 3). The CFBYTE is generally set based on the error correction code (ECC) capability of the memory (e.g., how many cells the ECC may perform error correction on per page write), and is often about 10 to 100 times lower than the ECC limit. As long as the total failing cells for a particular level are below the number specified by the CFBYTE, the failure to program these memory cells is allowed and they are further inhibited (from further programming) for all subsequent program pulses. Moreover, the memory controller may also stop issuing verify pulses for that program level in all subsequent program loops.

The CFBYTE (or other error threshold) may be considered part of data program completion (DPC) criteria. Determining whether the DPC is met may involve counting the number of bits that have failed in order to determine whether the number of failing bits is below the CFBYTE specified in the DPC criteria. This counting of the number of cells that have failed may occur after every program loop. The overhead associated with this counting increases power consumption, slows down programming, and takes up valuable chip space (e.g., due to special circuits associated with the DPC procedure which are often called count-fail-byte (CF-BYTE) circuits) on a storage device.

Various embodiments of the present disclosure eliminate the counting of failed bits during the DPC evaluation process by utilizing process characteristics (e.g., a distribution of threshold voltages of various cells) associated with the cells of a memory and program operation parameters to specify how many loops will be used to program the cells and in which loops verify program pulses for each level will be used. In various embodiments, not all program levels receive a verify pulse in each program loop. In particular embodiments, verify pulses are issued starting in the program loop in which fastest to program cells are expected to pass verify and ending in the program loop in which the slowest to program cells are expected to be below a threshold (e.g., CFBYTE).

Other embodiments of the present disclosure reduce the overhead associated with DPC by counting the failed bits of only a portion of the cells programmed during a program sequence. The cells included in the counting may be arranged in any suitable memory on the NAND flash memory (e.g., the cells may be physically isolated or randomly distributed throughout the array).

Various embodiments of the present disclosure may provide technical advantages, such as reducing circuit complexity (e.g., counting circuitry may be reduced or eliminated in some embodiments), improving programming performance, and reducing power usage.

CPU 102 comprises a processor 108, such as a microprocessor, an embedded processor, a digital signal processor (DSP), a network processor, a handheld processor, an application processor, a co-processor, a system on a chip (SOC), or other device to execute code (i.e., software instructions). Processor 108, in the depicted embodiment, includes two processing elements (cores 114A and 114B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices, which may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 106 coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 102) or may be integrated on the same chip as the CPU 102.

CPU memory controller 112 is an integrated memory controller that includes logic to control the flow of data going to and from one or more memory devices 107. CPU memory controller 112 may include logic operable to read from a memory device 107, write to a memory device 107, or to request other operations from a memory device 107. In various embodiments, CPU memory controller 112 may receive write requests from cores 114 and/or I/O controller 110 and may provide data specified in these requests to a memory device 107 for storage therein. CPU memory controller 112 may also read data from a memory device 107 and provide the read data to I/O controller 110 or a core 114. During operation, CPU memory controller 112 may issue commands including one or more addresses of the memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

The CPU 102 may also be coupled to one or more other I/O devices through external I/O controller 104. In a particular embodiment, external I/O controller 104 may couple a storage device 106 to the CPU 102. External I/O controller 104 may include logic to manage the flow of data between one or more CPUs 102 and I/O devices. In particular embodiments, external I/O controller 104 is located on a motherboard along with the CPU 102. The external I/O controller 104 may exchange information with components of CPU 102 using point-to-point or other interfaces.

A memory device 107 may store any suitable data, such as data used by processors 106 to provide the functionality of computer system 100. For example, data associated with programs that are executed or files accessed by cores 110 may be stored in memory device 107. Thus, a memory device 107 may include a system memory that stores data and/or sequences of instructions that are used or executed by the cores 114. In various embodiments, a memory device 107 may store persistent data (e.g., a user's files or instruction sequences) that remains stored even after power to the memory device 107 is removed. A memory device 107 may be dedicated to a particular CPU 102 or shared with other devices (e.g., one or more other processors or other device) of computer system 100.

In various embodiments, a memory device 107 may include a memory comprising any number of memory modules, a memory device controller, and other supporting logic (not shown). A memory module may include non-volatile memory and/or volatile memory. Non-volatile memory is a storage medium that does not require power to maintain the state of data stored by the medium. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance. Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory module is synchronous dynamic random access memory (SDRAM). In some embodiments, any portion of memory 107 that is volatile memory can comply with JEDEC standards including but not limited to Double Data Rate (DDR) standards, e.g., DDR3, 4, and 5, or Low Power DDR4 (LPDDR4) as well as emerging standards.

A storage device 106 may store any suitable data, such as data used by processor 108 to provide functionality of computer system 100. For example, data associated with programs that are executed or files accessed by cores 114 may be stored in storage device 106. Thus, in some embodiments, a storage device 106 may include a system memory that stores data and/or sequences of instructions that are used or executed by the cores 114. In various embodiments, a storage device 106 may store persistent data (e.g., a user's files or software application code) that remains stored even after power to the storage device 106 is removed. A storage device 106 may be dedicated to CPU 102 or shared with other devices (e.g., another CPU or other device) of computer system 100.

In the embodiment depicted, storage device 106A includes a storage device controller 118 and a memory 116 comprising a plurality of memory modules 122A-D, however, a storage device may include any suitable number of memory modules 122. A memory module 122 includes a plurality of memory cells that are each operable to store one or more bits. The cells of a memory module 122 may be arranged in any suitable fashion, such as in rows (e.g., wordlines) and columns (e.g., bitlines), three dimensional structures, or other manner. In various embodiments, the cells may be logically grouped into banks, blocks, sub-blocks, wordlines, pages, frames, bytes, or other suitable groups. In various embodiments, a memory module 122 comprises one or more NAND flash memory arrays.

Figure 2:
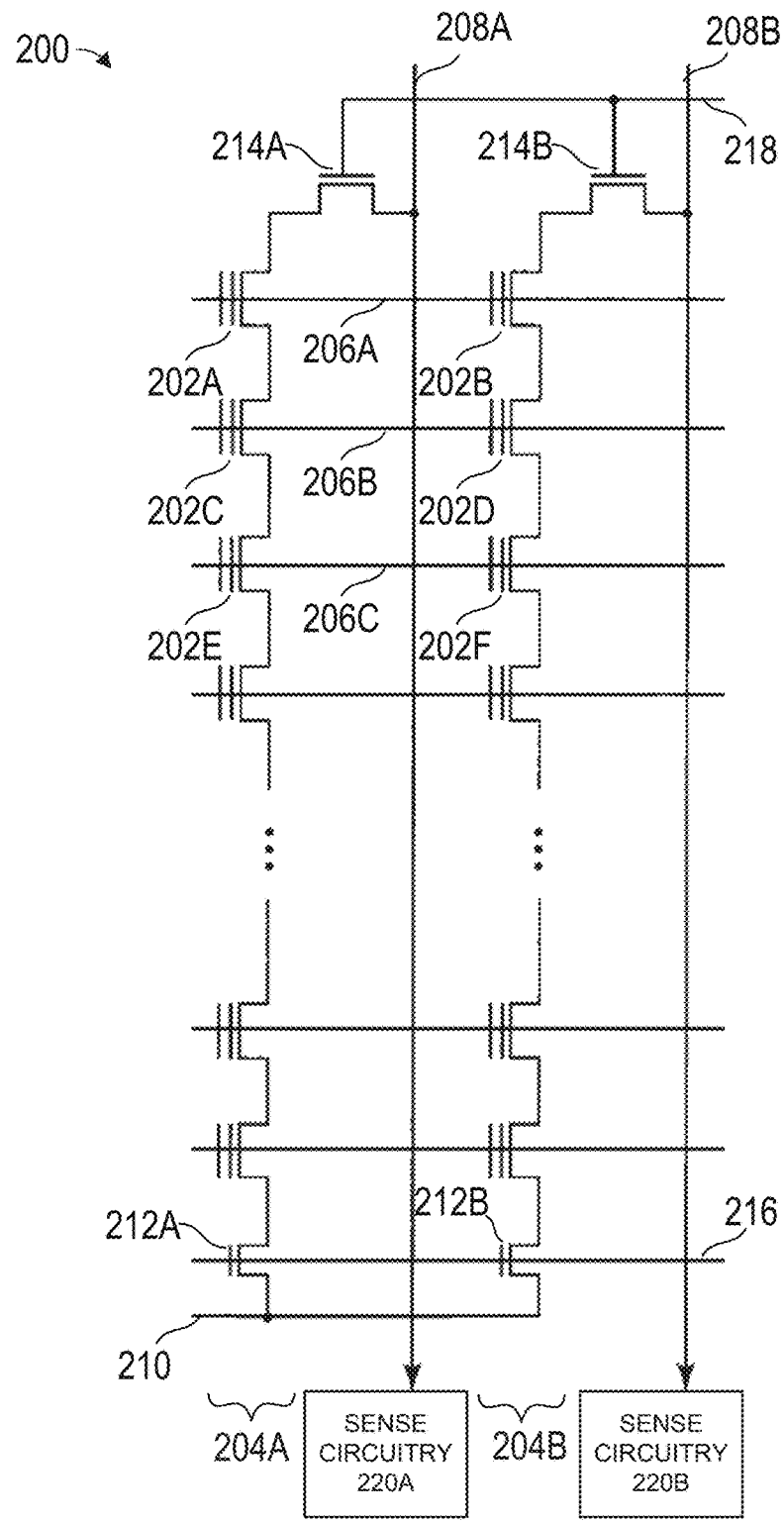
FIG. 2 illustrates an example diagram of a portion of a NAND flash memory array in accordance with certain embodiments.

FIG. 2 illustrates an example diagram of a portion of a NAND flash memory array 200 in accordance with certain embodiments. NAND flash memory array 200 may comprise a plurality of non-volatile memory cells 202 arranged in columns such as series strings 204. In various embodiments, a memory cell 202 may comprise a transistor with a floating gate that stores charge indicative of one or more bit values stored by the memory cell 202. In the series strings 204, the drains of the cells 202 are each (with the exception of the top cell) coupled to a source of another cell 202.

The array 200 also includes wordlines 206. A wordline 206 may span across multiple series strings 204 (e.g., being coupled to one memory cell of each series string 204) and are connected to the control gates of each memory cell 202 of a row of the array 200 and used to bias the control gates of the memory cells 202 in the row. The bitlines 208 are each coupled to a series string 204 by a drain select gate 214 and sensing circuitry 220 that detects the state of each cell by sensing voltage or current on a particular bitline 208.

Each series string 204 of memory cells is coupled to a source line 210 by a source select gate 212 and to an individual bit line 208 by a drain select gate 214. The source select gates 212 are controlled by a source select gate control line 216 and the drain select gates 214 are controlled by a drain select gate control line 218.

Figure 3:
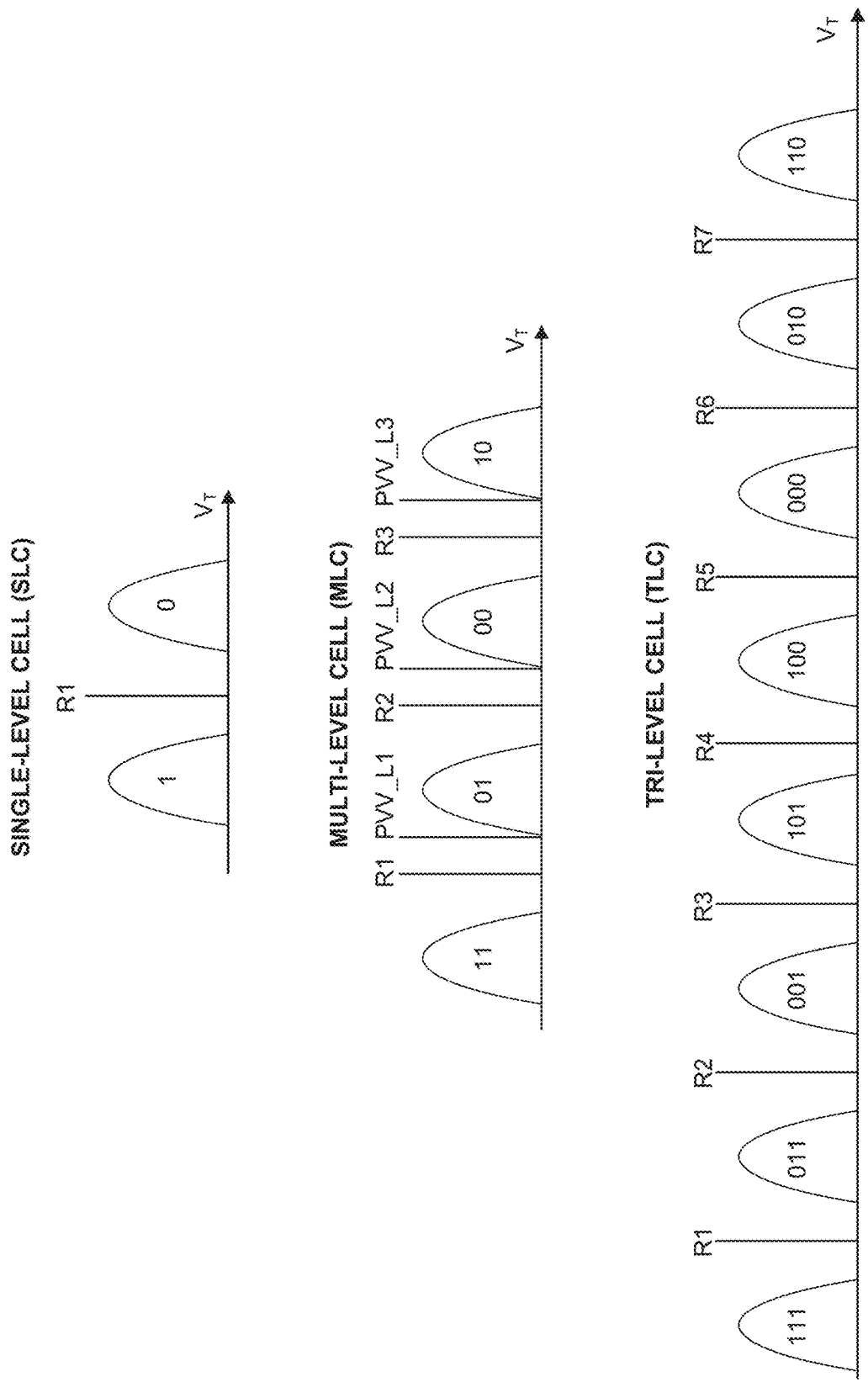
FIG. 3 illustrates example encoding schemes for NAND flash memory cells in accordance with certain embodiments.

In various embodiments, each memory cell 202 can be programmed according to an SLC, MLC, TLC, a QLC, or other encoding scheme. Each cell's threshold voltage (Vt) is indicative of the data that is stored in the cell. FIG. 3 illustrates example encodings of bits within NAND flash memory cells 202 in accordance with certain embodiments. In the embodiment depicted, each elliptical region represents a range of threshold voltages that correspond to the value encoded within the cell. For example, in the SLC encoding scheme, lower threshold voltages correspond to the bit value 1 and higher threshold voltages correspond to the bit value 0. As another example, in the MLC encoding scheme, the lowest range of threshold voltages corresponds to "11", the next highest range of threshold voltages corresponds to "01", the next highest range of threshold voltages corresponds to "00", and the highest range of threshold voltages correspond to "10." Similarly, for the TLC encoding scheme (or other encoding schemes not shown), various ranges of threshold voltages correspond to various values of the bits encoded within each cell.

A program level may refer to one of the depicted regions. In other words, a program level may correspond to one of the bit encodings used in the encoding scheme. In general, if a cell is to store the value represented by the lowest voltage region, the cell does not need to be programmed (since in its erased state it has a threshold voltage in the lowest voltage region). Accordingly, as used herein, the next lowest region (e.g., "01" of the MLC scheme or "011" of the TLC scheme) will be referred to as the first program level, the next region (e.g., "00" of the MLC scheme or "001" of the TLC scheme) will be referred to as the second program level, and so on. Under this terminology, the MLC scheme has three program levels, the TLC scheme has seven program levels, and the QLC scheme has fifteen program levels. When data (e.g., one or more pages) is written to memory 116, a plurality of the cells may be programmed to a first program level, a plurality of the cells may be programmed to a second program level, and so on.

The various R voltage values depicted in FIG. 3 (e.g., R1, R2, R3, . . . ) represent read voltages that may be applied to a wordline when the values of the cells are being read. When a particular read voltage is replied, sense circuitry 220 may determine whether the threshold value of a cell is greater than or less than the read voltage based on a voltage or current sensed by the sense circuitry 220. Although not shown in FIG. 3, a QLC encoding scheme may utilize a similar scheme where fifteen read voltages may be used to resolve the values of four bits within each cell, where R1<R2<R3 . . . <R15.

The various program verify voltages (PVV_L1, PVV_L2, and PVV_L3) depicted with respect to the MLC encoding scheme represent program verify voltages that may be applied to a cell during programming of the cell to determine whether the threshold voltage of the cell has reached its desired level. For example, if the cell is to be programmed to "01" (i.e., program level 1), then PVV_L1 may be applied to the cell during a verify procedure and if sensing circuitry 220 determines that the threshold voltage of the cell is greater than PVV_L1, then the cell is considered to have passed programming. If the threshold voltage of the cell is less than PVV_L1, the cell is considered to not have passed programming (and as will be explained in greater detail below the storage device 106 may attempt to raise the threshold voltage of the cell or may allow the cell to fail and may later attempt error correction on the cell). As another example, if the cell is to be programmed to "00" (i.e., program level 2), then PVV_L2 may be applied to the cell during a verify procedure and if sensing circuitry 220 determines that the threshold voltage of the cell is greater than PVV_L2, then the cell is considered to have passed programming. Similarly, if the cell is to be programmed to "10" (i.e., program level 3), then PVV_L3 may be applied to the cell during a verify procedure. Any suitable program verify voltages may be used for any of the encoding schemes. In particular embodiments and as depicted, the program verify voltage is set to a value that is at or near the beginning of the corresponding threshold voltage range. There may be some margin between a PVV and a corresponding read level voltage to allow for slight threshold voltage droopage over time and to improve sensing accuracy. For example, the figure depicts a margin in between R1 and PVV_L1.

In particular embodiments, cells may be programmed a page at a time, where a page is stored in a group of cells that are coupled to the same wordline. For example, the group of cells may be identified by a particular wordline and a particular subblock. As another example, the group of cells may represent all of the cells of the wordline. The group of cells may store one page of data (if the cells are encoded according to an SLC scheme) or multiple pages of data (if the cells are encoded according to an MLC, TLC, QLC, or other multi-level encoding scheme).

In various embodiments, a cell that is encoded to store multiple bits may form a part of multiple different pages, with each bit of the cell corresponding to a distinct page. For example, for a cell that is encoded with two bits (i.e., using a MLC encoding scheme), one bit may correspond to an upper page (UP) and the other bit may correspond to a lower page (LP). As another example, for a cell that is encoded with three bits (i.e., using a TLC encoding scheme), one bit may correspond to an LP, one bit may correspond to a UP, and the other bit may correspond to an extra page (XP). As yet another example, for a cell that is encoded with four bits (i.e., using a QLC encoding scheme), one bit may correspond to an LP, another bit may correspond to a UP, another bit may correspond to an XP, and the final bit may correspond to a top page (TP). Each page (e.g., LP, UP, XP, or TP) may comprise an aggregation of corresponding bits from a plurality of different cells of a wordline. For example, referring to the encoding shown in FIG. 3, all of the rightmost bits of a plurality of cells encoded using a TLC scheme may form an LP, all of the middle bits of the plurality of cells may form a UP, and all of the leftmost bits of the plurality of cells may form an XP.

A single programming pass (which may comprise multiple programming loops) of a programming sequence may encode one or more pages. For example, when the cells of a wordline are encoded using an MLC scheme, both pages (the LP and the UP) may be programmed during a single programming pass by setting the voltage levels of the cells to the desired program level (e.g., within one of the four voltage ranges depicted for the MLC scheme in FIG. 3). Alternatively, an LP could be programmed in a first pass and a UP could be programmed in a second pass. For example, during the first pass, first bits of the cells (where the first bits of the cells collectively form the LP) may be programmed to a binary state based on the desired value of each bit. For example, referring to the MLC scheme depicted in FIG. 3, if the rightmost bits of the cells form the LP, and a particular rightmost bit is to be programmed to a '0' value, the Vt of the cell may be programmed to a value that is greater than PVV_L2 in the first programming pass. If a particular rightmost bit is to be programmed to a '1' value, it may be left at a low voltage level. During the second pass, second bits of the same cells (where the second bits of the cells collectively form the UP) are programmed, resulting in the Vt of the cells being changed to their desired Vt (e.g., within one of the four voltage ranges depicted for the MLC scheme in FIG. 3), thus storing values for the UP and the LP. As other examples, when the cells of a wordline are encoded using a TLC scheme or a QLC scheme, all pages may be programmed during a single programming pass by setting the voltage levels of the cells to the desired program level, or one or more of the pages may be programmed during a first pass and the remaining pages programmed during a second pass.

In particular embodiments, if multiple passes are used to program the cells of a first wordline, one or more programming passes may be performed on one or more adjacent wordlines after an initial programming pass is performed on the first wordline and before an additional programming pass is performed on the first wordline. Such embodiments may mitigate the effects of interference caused to cells by the programming of neighboring wordlines. In other embodiments, multiple passes may be performed on the cells of a wordline before the next wordline is programmed.

In particular embodiments, a logical page of data (i.e., a page of data referred to by a computing host such as CPU 102) may correspond to an LP, UP, XP, TP, or other page of memory stored in cells that are encoded with multiple bits. Accordingly, two logical pages of data may correspond to an LP and a UP stored in a group of cells encoded using an MLC scheme, three logical pages of data may correspond to an LP, UP, and XP stored in a group of cells encoded using a TLC scheme, four logical pages of data may correspond to an LP, UP, XP, and TP stored in a group of cells encoded using a QLC scheme, and so on. Thus, when a computing host writes to storage device 106, if multiple pages are to be programmed in a single pass, multiple logical pages from the computing host may be aggregated and programmed in the pass. For example, in memory encoded using a TLC scheme, when the LP and UP are programmed in a single pass, two logical pages of data may be aggregated (where one logical page is stored in the LP and one logical page is stored in the UP).

Referring again to FIG. 1, a memory module 122 may include non-volatile memory, such as planar or 3D NAND flash memory. Non-volatile memory is a storage medium that does not require power to maintain the state of data stored by the medium. In particular embodiments, a memory module 122 with non-volatile memory may comply with one or more standards for non-volatile memory promulgated by the Joint Electron Device Engineering Council (JEDEC), such as JESD218, JESD219, JESD220-1, JESD220C, JESD223C, JESD223-1, or other suitable standard (the JEDEC standards cited herein are available at www.jedec.org). In particular embodiments, the storage device comprises NAND flash memory that complies with one or more portions of a standard promulgated by JEDEC for SDRAM memory, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Such standards (and similar standards) may be referred to as DDR-based standards and communication interfaces of the storage devices 106 that implement such standards may be referred to as DDR-based interfaces. For example, a storage device 106 comprising NAND flash memory may receive a command that has a format compliant with a DDR-based standard and may translate the command into one or more commands that are compatible with NAND flash memory of the storage device 106. Similarly, the storage device 106 may format results from operations performed on the NAND flash memory into a format that is compliant with a DDR-based standard before transmitting the results to the CPU 102.

Storage devices 106 may comprise any suitable type of memory and are not limited to a particular speed, technology, or form factor of memory in various embodiments. For example, a storage device 106 could be a disk drive (such as a solid state drive), a flash drive, memory integrated with a computing device (e.g., memory integrated on a circuit board of the computing device), a memory module (e.g., a dual in-line memory module) that may be inserted in a memory socket, or other type of storage device. Moreover, computer system 100 may include multiple different types of storage devices 106. Storage devices 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. Storage devices 106 may also include a communication interface to communicate with CPU memory controller 112 or I/O controller 110 in accordance with any suitable logical device interface specification such as NVMe, AHCI, or other suitable specification. In particular embodiments, storage device 106 may comprise multiple communication interfaces that each communicate using a separate protocol with CPU memory controller 112 and/or I/O controller 110.

Storage device controller 118 may include logic to receive requests from CPU 102 (e.g., via CPU memory controller 112 or I/O controller 110), cause the requests to be carried out with respect to memory 116, and provide data associated with the requests to CPU 102 (e.g., via CPU memory controller 112 or I/O controller 110). Controller 118 may also be operable to detect and/or correct errors encountered during memory operation. In an embodiment, controller 118 also tracks the number of times particular cells (or logical groupings of cells) have been written to in order to perform wear leveling and/or to detect when cells are nearing an estimated number of times they may be reliably written to. In performing wear leveling, the storage device controller 118 may evenly spread out write operations among blocks of the memory 116 such that particular blocks are not written to more than other blocks. In various embodiments, controller 118 may also monitor various characteristics of the storage device 106 such as the temperature or voltage and report associated statistics to the CPU 102. Storage device controller 118 can be implemented on the same chip, board, or device as memory 116 or on a different chip, board, or device. For example, in some environments, storage device controller 118 may be a centralized storage controller that manages memory operations for multiple different memories 116 (which could each be of the same type or could be of different types) of computer system 100 (and thus could provide storage device controller functionality described herein to any of the memories to which it is coupled).

In various embodiments, the storage device 106 also includes an address translation engine 120. In the depicted embodiment, the address translation engine 120 is shown as part of the storage device controller 118, although in various embodiments, the address translation engine 120 may be separate from the storage device controller 118 and communicably coupled to the storage device controller 118. In various embodiments, the address translation engine 120 may be integrated on the same chip as the storage device controller 118 or on a different chip.

In various embodiments, address translation engine 120 may include logic to store and update a mapping between a logical address space (e.g., an address space visible to a computing host coupled to the storage device 106) and the physical address space of the memory 116 (which may or may not be exposed to the computing host). The logical address space may expose a plurality of logical groups of data which are physically stored on corresponding physical groups of memory addressable through the physical address space of the storage device 106. A physical address of the physical address space may comprise any suitable information identifying a physical memory location (e.g., a location within memory 116) of the storage device 106, such as an identifier of the memory module 122 on which the physical memory location is located, one or more pages of the physical memory location, one or more subblocks of the physical memory location, one or more wordlines of the physical memory location, one or more bitlines of the physical memory location, or other suitable identifiers or encodings thereof.

The address translation engine 120 or other portion of storage device 106 may include any suitable memory type for storing logical to physical mapping structures and other information and any suitable logic for changing values stored in the logical to physical mapping structures and other information (e.g., in response to a request from the storage device controller 118) and reading values from the logical to physical mapping structures and other information (e.g., to provide the values to the storage device controller 118 for use in memory operations).

Storage media for the logical to physical mapping structures and other information may be included within the address translation engine 120 and/or storage device controller 118 or may be communicably coupled to the address translation engine and/or storage device controller. In various embodiments, storage media for the logical to physical mapping structures and other information may be integrated on the same chip as the storage device controller 118 and/or address translation engine 120 or may be implemented on a separate chip.

In various embodiments, the address translation engine 120 and/or storage device controller 118 may provide wear leveling through management of the address mappings of the logical to physical mapping structures and other information. In particular embodiments, the address translation engine 120 and/or storage device controller 118 may also prevent the use of bad memory cells (or logical grouping of cells) by not allowing physical addresses for the bad cells (or logical grouping of cells) to be mapped to the logical address space.

In various embodiments, the storage device 106 also includes program control logic 124 which is operable to control the programming sequence performed when data is written to memory 116. In various embodiments, program control logic 124 may determine how many program loops to perform and in which loops program verify voltages should be applied for each program level. In some embodiments, program control logic 124 may evaluate the DPC criteria. In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 may be located on the same chip as memory 116 and/or memory modules 122.

In some embodiments, all or some of the elements of system 100 are resident on (or coupled to) the same circuit board (e.g., a motherboard). In various embodiments, any suitable partitioning between the elements may exist. For example, the elements depicted in CPU 102 may be located on a single die or package (i.e., on-chip) or any of the elements of CPU 102 may be located off-chip. Similarly, the elements depicted in storage device 106A may be located on a single chip or on multiple chips. In various embodiments a storage device 106 and a computing host (e.g., CPU 102) may be located on the same circuit board or on the same device and in other embodiments the storage device 106 and the computing host may be located on different circuit boards or devices.

The components of system 100 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments an integrated I/O subsystem includes point-to-point multiplexing logic between various components of system 100, such as cores 114, one or more CPU memory controllers 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a computing host (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 4:
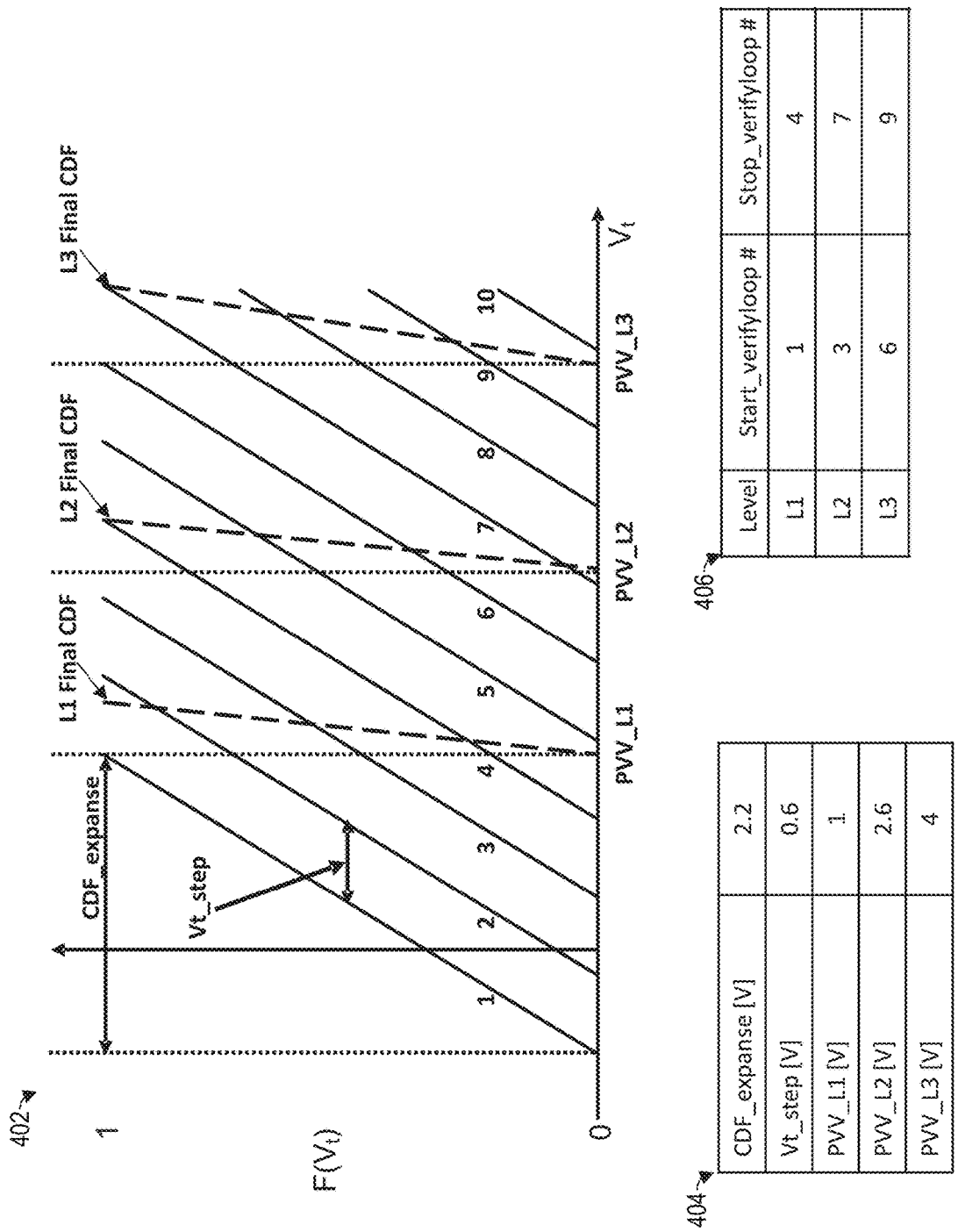
FIG. 4 illustrates an example programming sequence and example cumulative distribution functions of threshold voltages for multi-level cell (MLC) NAND flash memory cells in accordance with certain embodiments.

FIG. 4 illustrates an example programming sequence and example cumulative distribution functions of threshold voltages for MLC NAND flash memory cells in accordance with certain embodiments. In various embodiments, a programming sequence may utilize, for each program level, start verify and stop verify loop counts for applying a verify pulse for that program level, rather than indications from DPC evaluation logic indicating whether each program level is complete.

Graph 402 depicts the progression of cell Vts using an MLC encoding scheme (where each one of CDFs 1-10 represent the CDF of Vts of the cells after the corresponding program loop), table 404 depicts various process characteristics and operating parameters, and table 406 depicts the calculated start verify and stop verify loop counts for each level (based on the process characteristics and operation parameters in table 404). As seen from the upper right portion of CDF 1 of graph 402, the fastest to program cells exceed the program verify voltage (PVV) for program level 1 after the first program loop and therefore program level 1 is to be verified starting from the first loop (i.e., the cells that are to be programmed to program level 1 are to receive a verify pulse of PVV_L1 in order to determine whether they have threshold voltages greater than PVV_L1 and thus may be inhibited for additional program loops or lower than PVV_L1 in which case they should be included in one or more additional program loops). However, program level 2 is not verified during the first program pass, since the fastest to program cells are still three program loops away from reaching PVV_L2. For program loops occurring after the fourth program loop, program level 1 is not verified since it is assumed (based on the threshold voltage distributions) that all cells (with a few possible exceptions) will have Vts greater than PVV_L1 following the application of one additional program voltage pulse.

In various embodiments, the start verify and stop verify loop counts for each program level (and the total number of program loops since the program sequence ends after the stop verify loop count of the last program level is reached) are calculated based on process characteristics associated with the cells of a memory and program operation parameters. Various process characteristics and operation parameters that may be used to calculate start verify and stop verify loop counts are described below.

The first process characteristic that may be used is the cumulative distribution function (CDF) of the program threshold voltages (Vts) of a group of cells (e.g., a page, a wordline, an entire array, or other group) of the memory 116. The cumulative distribution function (CDF) of a real-valued random variable X evaluated at x, is the probability that X will take a value less than or equal to x. In the graph depicted in FIG. 4, the x axis is Vt and the Y axis is the value of the cumulative distribution function of Vt, expressed as F(Vt), where a value of 0 for F(Vt) at a point means no cells are at or below the corresponding Vt and a value of 1 for F(Vt) at a point means all cells are at or below the corresponding Vt.

Each of CDFs 1-10 represent the CDF of threshold voltages of the cells after a program voltage has been applied. For example, CDF 1 represents a CDF of the Vts of the cells after a first program voltage is applied in a first program loop, CDF 2 represents a CDF of the Vt of the cells after a second program voltage is then applied in a second program loop. CDF 3 represents a CDF of the Vt of the cells after a third program voltage is then applied in a third program loop, and so on. With each subsequent program pulse (of higher program voltage), the shape of the threshold voltage CDF remains unchanged, but laterally shifts on the threshold voltage axis based on the magnitude of the program voltage step.

Threshold voltages of the cells are determined by numerous factors such as cell geometry, doping concentration in the channel, or other process parameters, which generally tend to be normal Gaussian distributions with associated medians and standard deviations. Accordingly, the CDFs 1-10 depicted in FIG. 4 increase linearly as a function of Vt. In the particular example where the threshold voltages follow a Gaussian distribution, with each subsequent program pulse, the distribution moves to higher threshold voltages while maintaining the same standard deviation. Various embodiments of the present disclosure are based on the representative Gaussian distribution of the Vts, although the teachings of this disclosure are applicable to any suitable CDF describing the distribution of cell Vts.

In the embodiment depicted, CDFs 1-10 (with CDFs 8, 9, and 10 being truncated) may represent CDFs that result when none of the cells are inhibited as the program voltage is successively stepped up (during actual programming, cells are inhibited once they reach their appropriate threshold voltage value). Alternatively, the CDFs 1-10 may be viewed as the CDFs of the remaining uninhibited cells during an actual programming sequence. The result of the inhibiting is partially shown by the L1, L2, and L3 Final CDFs which show the CDFs for cells programmed to program level 1, program level 2, and program level 3 respectively after the programming sequence is complete (whereas each of CDFs 1-10 correspond to all of the cells in the group or all of the uninhibited cells).

The second process characteristic that may be used is the program slope, that is, the median shift in the CDF for cell Vts (i.e., the Vt_step as illustrated in 402) divided by the program voltage step (Vpgm_step), where Vpgm_step is the difference in the program voltage from one program pulse (e.g., of a first program loop) to the next program pulse (e.g., of a second program loop). As an example, if the program voltage is stepped up by 1 V, but the median of the CDF only shifts 0.8 V, the program slope is 0.8.

In various embodiments, testing may be performed in order to determine process characteristics. The characteristics may be discovered using any suitable test sequence. For example, a single pulse of a moderate program voltage may be applied to the group of cells for which the CDF and Vt_step are being determined and the Vts of all the cells sensed (e.g., by sweeping a verify pulse across a range of voltages and sensing the cells). A pulse of a higher program voltage may be applied, and the Vts of all the cells are sensed again. The resulting CDF may allow the calculation of the Vt_step as well as the program slope (in combination with the difference in the program voltages). In some embodiments, it may be assumed that the CDF will retain its shape and undergo similar lateral shifts as increased program voltages are applied (or data indicating how the CDF shape or the program slope may change as the program voltage rises may be used to extrapolate the additional CDFs). Alternatively, program voltages across the range of program voltages may be tested to verify that the CDF retains its shape and that the program slope doesn't change as the program voltage is increased.

In various embodiments, process characteristics obtained from testing a group of cells (e.g., a page of an array) may be assumed to be representative of a larger group of cells or the entire die (e.g., memory module 122) or multiple dies (if process variability between dies is negligible). In some embodiments, groups of cells from each die are tested in order to obtain accurate data on the process characteristics for each die. The cells may be tested at any suitable time, such as during probe-testing at the die level (before assembly), after assembly but before the storage device is deployed, and/or after the storage device is deployed (e.g., to adjust for any process characteristics that have changed over time).

Similarly, the start verify and stop verify loop counts may be calculated at any suitable time, and are generally calculated prior to the storage device receiving any write commands for which the start and stop loop counts are to be used. In various embodiments, the start verify and stop verify loop counts are calculated in conjunction with the testing of the process characteristics. Thus, the start verify and stop verify loop counts may be calculated at the time of the manufacturing of the storage device 106 and/or memory 116, before the storage device 106 is put into use, and/or after the storage device 106 has been used (e.g., to recalibrate the start verify and stop verify loop counts based on changes to the memory 116 occurring as a result of use). In some embodiments, an end user (via a programming interface of the storage device 106) may be able to specify the start verify and stop verify loop counts (or at least provide a parameter stating how conservatively the storage device should set such counts).

In addition to the Vpgm_step parameter discussed above, the programming sequence may utilize other operation parameters, such as a wordline start voltage (WLSV) and level-specific program-verify voltages (PVVs). A WLSV represents the program voltage that is applied to the wordline during the first program loop of the program sequence. A PVV for a particular program level represents the voltage of the verify pulse that is applied to determine whether a cell has reached that particular program level. In various embodiments, WLSV may be dynamically chosen such that the first program loop causes the fastest to program cells to barely exceed the PVV for the first program level (PVV_L1). As depicted in FIG. 4 by CDF 1 (which may represent the CDF of cell Vts after the program pulse in the first program loop has been applied), a few of the cells have reached PVV_L1.

As described above, a start verify loop count for a program level N (LN) may represent the first program loop in which verify pulses are issued for that program level, while a stop verify loop count for a program level N may represent the last loop count in which verify pulses are issued for that program level. In one embodiment, the start verify loop count for a program level N may be calculated by the storage device controller 118, according to the formula below:

$$\text{Start\_verify\_LN}=1+\text{FLOOR}((\text{PVV\_LN}-\text{PVV\_}L1)/Vt\_\text{step})$$

where Vt_step=Vpgm_step*program_slope and the FLOOR(x) function rounds x down to the lowest previous integer.

This equation aims to begin application of a verify pulse for a particular program level around the time that some cells have reached the PVV of the program level (or the program loop before the cells are expected to reach the PVV). For illustration purposes, in FIG. 4, the verify pulses start at loop 1 for program level 1, loop 3 for program level 2, and loop 6 for program level 3. This lines up with the graph of FIG. 4, as CDF 1 reaches to PVV_L1, CDF 3 is close to reaching PVV_L2, and CDF 6 reaches to PVV_L3.

In one embodiment, the stop verify loop count (stop_verify_LN) for a program level N may be calculated by the storage device controller, according to the formula below:

$$\text{Stop\_verify\_LN}=1+\text{FLOOR}((\text{PVV\_LN}+\text{CDF\_expanse}-\text{PVV\_}L1)/Vt\_\text{step})$$

where the expanse of the CDF (CDF_expanse) is the Vt difference between the fastest to program and slowest to program cells. In various embodiments, calculation of the CDF_expanse may involve disregarding a small number of outlier cells that are particularly fast to program or particular slow to program.

The equation for the stop verify loop count aims to end application of a verify pulse for a particular program level after all cells (other than possibly a few slower to program cells that may be corrected via the ECC) have reached the PVV of the program level or are one loop away from reaching the PVV of the program level (in various embodiments, after the verify pulses are stopped, an additional program loop that does not include a verify pulse for the particular level may be performed before all cells of that level are inhibited). For illustration purposes, in FIG. 4, the verify pulses stop at program loop 4 for program level 1, program loop 7 for program level 2, and program loop 9 for program level 3. This lines up with the graph of FIG. 4, as the leftmost point of CDF 4 is one program loop away from being past PVV_L1, the leftmost point of CDF 7 is one program loop away from being past PVV_L2, and the leftmost point of CDF 9 is one program loop away from being past PVV_L3.

The number of loops in which verify pulses will be issued for a particular level is dependent on the magnitude of the CDF_expanse. As an example, a larger standard deviation (sigma) for a Gaussian distribution of cell Vts will result in a higher CDF_expanse and thus a higher number of loops including verify pulses.

In various embodiments, the magnitude of the CDF_expanse is determined by the strength of the error correction code (ECC) available for the memory device. For example, there may be a tail on the bottom left end of the CDF due to one or more cells being particularly slow to program. Based on the strength of the ECC, one or more of these cells on the tail may be ignored (thus the starting point for the measurement of the CDF_expanse may not be the true beginning of the CDF) when calculating the CDF_expanse (e.g., relatively more slower to program cells may be ignored in determining the length of the CDF_expanse when the ECC is able to correct a relatively large number of cells in error).

As alluded to above, during the program loop that occurs after the stop_verify_LN loop for a particular level, the cells remaining to be programmed to the program level N may be given their final program pulse before being inhibited for the remainder of the program algorithm.

The criteria used to select the start verify loop counts and/or stop verify loop counts for each program level may be chosen such that the actual number of cells left behind are significantly lower than the predetermined ECC limit. Additionally, adequate guard band may be allotted to account for cells which are slower or faster (than expectation) to program. For example, the equations above could be modified to:

$$\text{Start\_verify\_LN}=0+\text{FLOOR}((\text{PVV\_LN}-\text{PVV\_}L1)/Vt\_\text{step})(\text{for LN}>1)$$

$$\text{Stop\_verify\_LN}=2+\text{FLOOR}((\text{PVV\_LN}+\text{CDF\_expanse}-\text{PVV\_}L1)/Vt\_\text{step}) \text{ or}$$

$$\text{Stop\_verify\_LN}=1+\text{CEILING}((\text{PVV\_LN}+\text{CDF\_expanse}-\text{PVV\_}L1)/Vt\_\text{step})$$

The earlier start_verify_LN value may protect against fast to program cells overshooting the desired Vt, while a later stop_verify_LN may result in less slower to program cells being left behind.

Although, various equations are listed for determining start verify loop counts and stop verify loop counts, other methods based on any suitable process characteristics may be used. For example, the CDFs shown in FIG. 4 may be obtained via testing and the start verify loop counts and stop verify loop counts may be set for each program level based on which program levels each CDF crosses. For example, a start verify loop count and a stop verify loop count for a particular program level may be based on the percentage of cells that are expected to be between the PVV for that level and the PVV for the next level during each program loop. For example, the stop verify loop count may be set to a level at which an expected number of cells failing after the following program loop is performed is below a certain threshold (e.g., CFBYTE). In other embodiments, start verify loop counts and stop verify loop counts may be based on one or more distribution of Vts that do not include the entire distribution of Vts for the cells. For example, testing may be performed to determine the concentration of the slowest to program cells and the fastest to program cells (rather than the entire CDF) (e.g., by sweeping a verify voltage at a lower range and then an upper range). The CDF_expanse and the Vt_step could be estimated based on this data and used to determine values for the start verify loop counts and stop verify loop counts.

Figure 5:
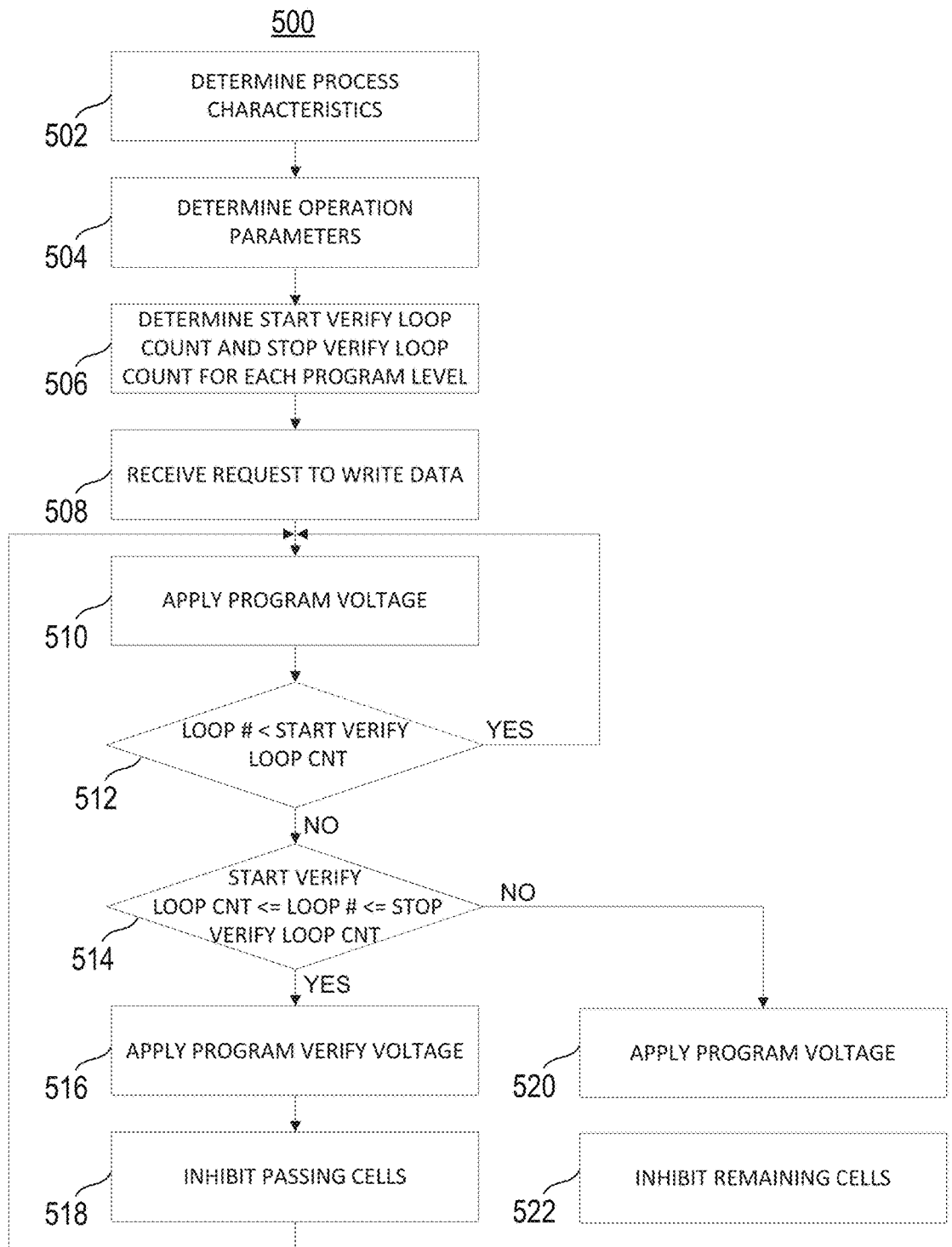
FIG. 5 illustrates an example flow for programming NAND flash memory cells in accordance with certain embodiments.

FIG. 5 illustrates an example flow for programming NAND flash memory cells in accordance with certain embodiments. The flow 500 depicts example operations that may be performed by any suitable logic, such as one or more components of a storage device 106.

At 502, process characteristics of a NAND flash memory 116 are determined. For example, one or more CDFs of Vts of a group of cells of the memory 116, a CDF expanse, a threshold voltage step (VT_step), and a program slope may be determined. At 504, operation parameters for a program sequence are determined. Any suitable operation parameters may be determined, such as a wordline start voltage, level-specific program verify voltages, and a program voltage step may be determined. In various embodiments, one or more operation parameters may be determined before one or more process characteristics, or vice versa.

At 506, a start verify loop count and a stop verify loop count (collectively a verify loop count set) are determined for each program level. For example, if the programming is to use MLC encoding, three sets of verify loop counts may be determined. As another example, if the programming is to use TLC encoding, seven sets of verify loop counts may be determined. In various embodiments, the verify loop counts may be based on one or more of the process characteristics and one or more of the operation parameters.

At 508, a request to write data is received from a computing host (e.g., CPU 102). The programming sequence begins and at 510, a program voltage (e.g., the wordline start voltage) is applied, e.g., to a wordline specified by the request. Operations 512-520 may be performed on a per-program level basis (e.g., the operations may be performed separately for each program level for the cells that are to be programmed to the program level). At 512, it is determined whether the loop number is smaller than the start verify loop count. If so, no verify pulse is applied for the program level, and the program voltage is stepped up and applied again at 510. If the loop number is greater than or equal to the start verify loop count and smaller than or equal to the stop verify loop count, the program verify voltage for the program level is applied at 516 and passing cells are inhibited from further programming at 518. The program voltage is stepped up and applied again at 510. If the loop number is greater than the stop verify loop count as determined at 514, then an additional program voltage is applied at 520 and all remaining uninhibited cells marked to be programmed to the particular program level are inhibited at 522.

The flow described in FIG. 5 is merely representative of operations that may occur in particular embodiments. In other embodiments, additional operations may be performed by the components of system 100. Various embodiments of the present disclosure contemplate any suitable signaling mechanisms for accomplishing the functions described herein. Some of the operations illustrated in FIG. 5 may be repeated, combined, modified or deleted where appropriate. Additionally, operations may be performed in any suitable order without departing from the scope of particular embodiments.

Figure 6:
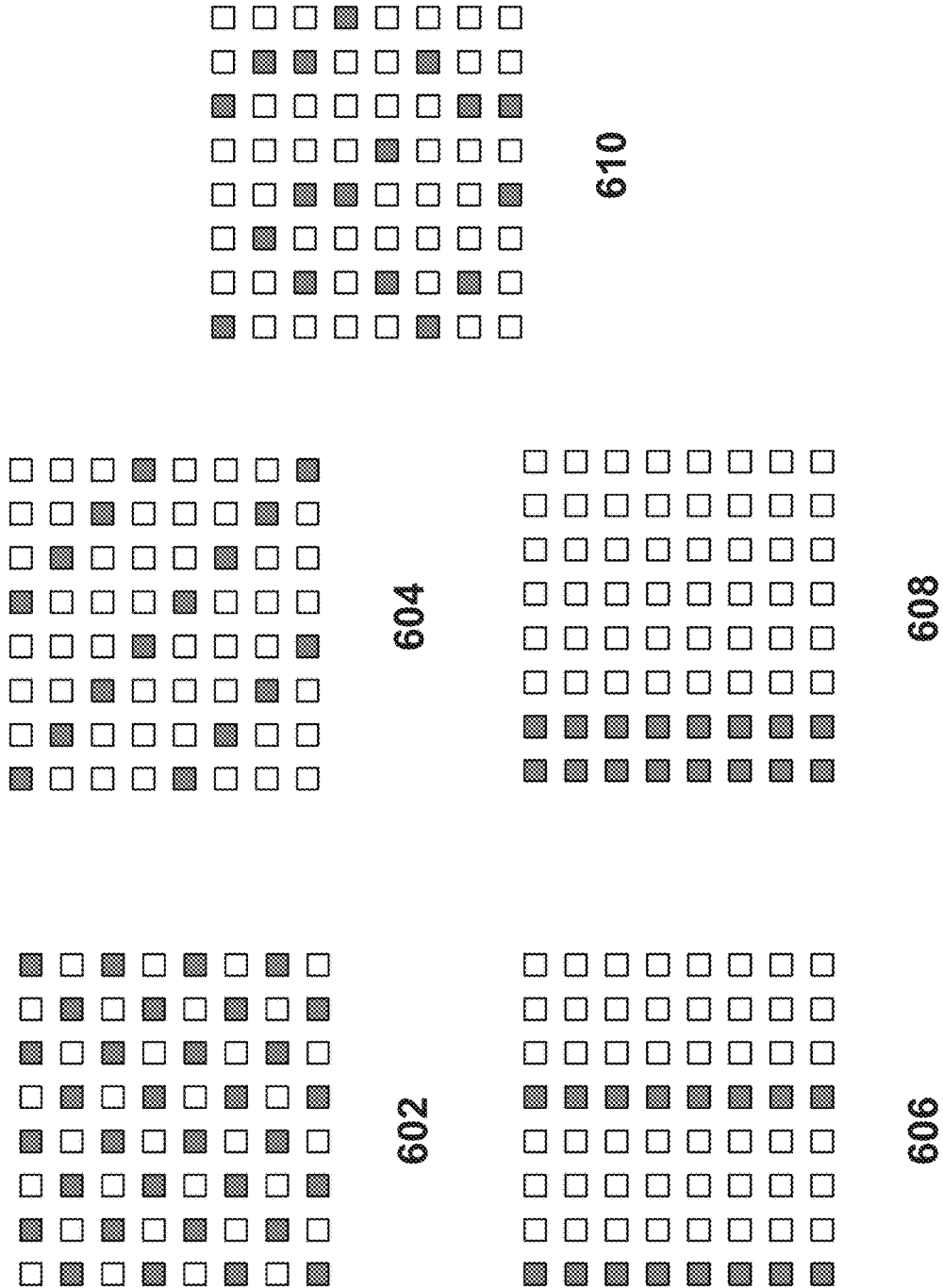
FIG. 6 illustrates example cell layouts for error tracking performed during programming of NAND flash memory cells in accordance with certain embodiments.

FIG. 6 illustrates example cell layouts 602-610 for error tracking during programming of NAND flash memory cells in accordance with certain embodiments. In various embodiments, the cells included in the counting during DPC evaluation may be arranged in a pattern, physically isolated, and/or randomly distributed throughout the array. In the example cell layouts, each square may represent a memory cell, the rows of the layouts may represent wordlines, and the columns may represent bitlines. The layouts depict only a small portion of an actual memory array. In the embodiment depicted, the gray squares represent memory cells that are to be tracked during DPC evaluation. That is, after each program loop, if the gray cell does not pass the appropriate program verify voltage, the cell is counted as an error (whereas the cells in white are ignored during the DPC evaluation).

As mentioned above, in some embodiments, the overhead associated with DPC evaluation may be reduced by counting the failed bits of only a portion of the cells programmed during a program sequence rather than all of the failed bits of the cells programmed (e.g., one or more pages). Since the number of cells programmed may be a rather large number (e.g., 16,000 cells in some embodiments), the number of cells that are tracked may be reduced significantly while still providing a reliable indication of the failure rate of all of the cells programmed. Such embodiments may reduce the circuitry and power used during DPC evaluation in proportion to the fraction of cells that are tracked.

The cells that are tracked may be distributed among the array in any suitable manner. In layout 602, for a first wordline, the cells belonging to all even bitlines are tracked. For the second wordline, the cells belonging to all odd bitlines are tracked. For a third wordline, the cells belonging to all even bitlines are tracked, and so on with adjacent rows having different bitlines that are tracked. In this embodiment, the number of cells that are tracked is cut in half.

In layout 604, one out of every four cells in a row are tracked and the cells are distributed such that every fourth wordline tracks cells in the same bitline. In this embodiment, the number of cells that are tracked is reduced by a factor of four.

In layout 606, one out of every four cells in a row are tracked and each wordline tracks cells in the same bitlines. In this embodiment, the number of cells that are tracked is reduced by a factor of four. By tracking the same bitlines, this embodiment may reduce the complexity of the counting circuitry since the counting circuitry would only be coupled to these bit lines.

In layout 608, only one out of every four cells on the same bitlines for each wordline are tracked. In various embodiments, any suitable number of adjacent bitlines (e.g., 4,000 when a page is 16,000 cells) may be tracked. Such embodiments may further reduce the complexity of the counting circuitry by allowing location of the counting circuitry to be placed near the bitlines that are tracked, thus reducing interconnect complexity.

In layout 610, the tracked cells are distributed randomly across the wordlines. Such embodiments may increase the chance that the tracked cells accurately represent the entire group of cells that is being programmed since the cells will not be susceptible to localized skews in process characteristics.

Figure 7:
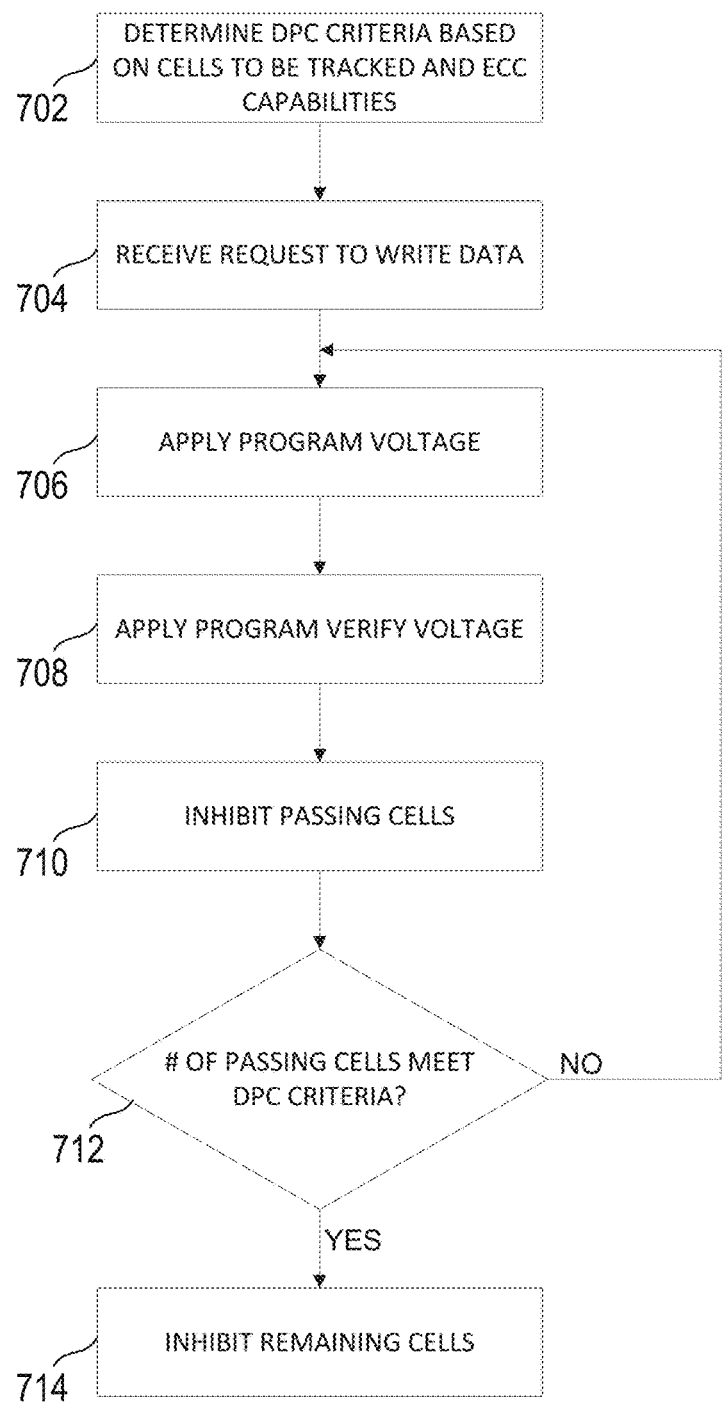
FIG. 7 illustrates another example flow for programming NAND flash memory cells in accordance with certain embodiments.

FIG. 7 illustrates another example flow for programming NAND flash memory cells in accordance with certain embodiments. The flow 700 depicts example operations that may be performed by any suitable logic, such as one or more components of a storage device 106.

At 702, DPC criteria is determined based on cells to be tracked and the ECC capabilities of the storage device 106. For example, for each program level, the number of the cells that may fail for that program level is determined based on the number of cells that may be corrected by the ECC and the proportion of the total cells of the array that are to be tracked. The number of cells that may fail per program level may be the same for each program level or may be different across program levels. In various embodiments, the number of cells that may fail for a program level may be reduced (relative to the number of cells that would be allowed to fail when all cells are tracked) based on the fraction of the cells that are tracked relative to the number of total cells.

At 704, a request to write data is received from a computing host. Operations 708-714 may be performed on a per-program level basis (e.g., the operations may be performed separately for each program level for the cells that are to be programmed to the program level). At 706, a program voltage is applied. At 708, a program verify voltage is applied. At 710, cells that are above the program verify voltage are inhibited for the remainder of the programming sequence. At 712, it is determined whether the number of passing cells meet the DPC criteria. For example, the number of cells that are to be programmed to the particular program level but have failed to reach the program verify voltage are counted and if the result is higher than the threshold specified in the DPC criteria, then another program loop is performed and operations 706-712 are repeated. If the number of cells that have failed is lower than the threshold, the program level is considered to be complete and the remaining cells (if any) that are to be programmed to the program level are inhibited at 714.

The flow described in FIG. 7 is merely representative of operations that may occur in particular embodiments. In other embodiments, additional operations may be performed by the components of system 100. Various embodiments of the present disclosure contemplate any suitable signaling mechanisms for accomplishing the functions described herein. Some of the operations illustrated in FIG. 7 may be repeated, combined, modified or deleted where appropriate. Additionally, operations may be performed in any suitable order without departing from the scope of particular embodiments.

Although various embodiments have been described with respect to particular encoding schemes (e.g., MLC, TLC, QLC), the teachings of such embodiments may be equally applicable to memories using any suitable encoding levels, including encoding schemes that become feasible in the future.

Furthermore, even though some embodiments are generally discussed with reference to NAND flash, the teachings of the disclosure may be used with any type of non-volatile or volatile memory (such as those types described herein or other types) that have programming characteristics in common with NAND flash (such as programming in multiple loops or counting the number of cells not sufficiently programmed).

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or retransmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the functionality of the various components such as CPU 102, external I/O controller 104, processor 108, core 114, I/O controller 110, CPU memory controller 112, storage device 106, memory device 107, memory 116, memory module 122, storage device controller 118, address translation engine 120, program control logic 124, sense circuitry 220, or other entity or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or m/.ore gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

In at least one embodiment, An apparatus for reducing data program completion overhead in NAND flash comprises a storage device comprising a NAND flash memory, the storage device is to receive a write request from a computing host, the write request to specify data to be written to the NAND flash memory; perform a plurality of program loops to program the data into a plurality of cells of the NAND flash memory, wherein a program loop comprises application of a program voltage to a wordline of the memory to change the threshold voltage of at least one cell of the plurality of cells; and wherein the number of program loops used to program the data is to be determined prior to receipt of the write request and based on a distribution of threshold voltages of the cells or determined based on tracking a number of program errors for only a portion of the plurality of cells.

In an embodiment, the number of program loops used to program data for a program level of a plurality of program levels of the NAND flash memory is determined prior to receipt of the write request and based on the distribution of threshold voltages of the cells. In an embodiment, the number of program loops used to program data for a program level of a plurality of program levels of the NAND flash memory is determined based on tracking the number of errors for only a portion of the plurality of cells that are to be programmed to the program level. In an embodiment, the number of program loops used to program the data is to be determined further based on a program slope indicating the amount of change in threshold voltages of the plurality of memory cells due to increasing the program voltage by a particular amount. In an embodiment, the number of program loops used to program the data is to be determined further based on an expanse of the distribution of the threshold voltages of the cells. In an embodiment, the number of program loops used to program the data is set based on a stop verify loop count for a last program level, the storage device to stop applying a program verify voltage when a program loop count exceeds the stop verify loop count. In an embodiment, the storage device is further to calculate a start verify loop count and a stop verify loop count for a program level based on the distribution of the threshold voltages of the cells, a program slope, at least one program verify voltage, and a program voltage step, the storage device to apply a program verify voltage when a program loop count reaches the start verify loop count and to stop application of the program verify voltage when the program loop count exceeds the stop verify loop count. In an embodiment, the storage device is further to track errors for cells of alternating bitlines to determine the number of program loops used to program the data. In an embodiment, the storage device is further to track errors for one out of every N adjacent cells of the plurality of cells to determine the number of program loops used to program the data, where N is a positive integer greater than one. In an embodiment, the cells of the portion of the plurality of cells for which the number of errors are to be tracked are randomly distributed among the plurality of cells.

In at least one embodiment, a method comprises receiving a write request from a computing host, the write request to specify data to be written to a NAND flash memory; performing a plurality of program loops to program the data into a plurality of cells of the NAND flash memory, wherein a program loop comprises application of a program voltage to a wordline of the memory to change the threshold voltage of at least one cell of the plurality of cells; and wherein the number of program loops used to program the data is determined prior to receipt of the write request and based on a distribution of threshold voltages of the cells; or determined based on tracking a number of program errors for only a portion of the plurality of cells.

In an embodiment, the number of program loops used to program data for a program level of a plurality of program levels of the NAND flash memory is determined prior to receipt of the write request and based on the distribution of threshold voltages of the cells. In an embodiment, the number of program loops used to program the data is to be determined further based on a program slope indicating the amount of change in threshold voltages of the plurality of memory cells due to increasing the program voltage by a particular amount. In an embodiment, the number of program loops used to program the data is to be determined further based on an expanse of the distribution of the threshold voltages of the cells. In an embodiment, the number of program loops used to program the data is set based on a stop verify loop count for a last program level, the storage device to stop applying a program verify voltage when a program loop count exceeds the stop verify loop count. In an embodiment, the storage device is further to calculate a start verify loop count for a program level, the storage device to apply a program verify voltage when a program loop count reaches the start verify loop count. In an embodiment, the number of program loops used to program data for a program level of a plurality of program levels of the NAND flash memory is determined based on tracking the number of errors for only a portion of the plurality of cells that are to be programmed to the program level. In an embodiment, the method further comprises tracking errors for cells of alternating bitlines to determine the number of program loops used to program the data. In an embodiment, the method further comprises tracking errors for one out of every N adjacent cells of the plurality of cells to determine the number of program loops used to program the data, where N is a positive integer greater than one. In an embodiment, the cells of the portion of the plurality of cells for which the number of errors are to be tracked are randomly distributed among the plurality of cells.

In at least one embodiment, a system comprises a processor to send a write request to a storage device; and a storage device comprising a NAND flash memory and a storage device controller. The storage device controller is to receive the write request from the processor, the write request to specify data to be written to the NAND flash memory; perform a plurality of program loops to program the data into a plurality of cells of the NAND flash memory, wherein a program loop comprises application of a program voltage to a wordline of the memory to change the threshold voltage of at least one cell of the plurality of cells; and wherein the number of program loops used to program the data is determined prior to receipt of the write request and based on a distribution of threshold voltages of the cells; or determined based on tracking a number of program errors for only a portion of the plurality of cells.

In an embodiment, the number of program loops used to program data for a program level of a plurality of program levels of the NAND flash memory is determined prior to receipt of the write request and based on the distribution of threshold voltages of the cells. In an embodiment, the number of program loops used to program data for a program level of a plurality of program levels of the NAND flash memory is determined based on tracking the number of errors for only a portion of the plurality of cells that are to be programmed to the program level. In an embodiment, the number of program loops used to program the data is to be determined further based on a program slope indicating the amount of change in threshold voltages of the plurality of memory cells due to increasing the program voltage by a particular amount. In an embodiment, the system further comprises one or more of: a battery communicatively coupled to the processor, a display communicatively coupled to the processor, or a network interface communicatively coupled to the processor.

In at least one embodiment, a system comprises means for receiving a write request from a computing host, the write request to specify data to be written to a NAND flash memory; means for performing a plurality of program loops to program the data into a plurality of cells of the NAND flash memory, wherein a program loop comprises application of a program voltage to a wordline of the memory to change the threshold voltage of at least one cell of the plurality of cells; and wherein the number of program loops used to program the data is determined prior to receipt of the write request and based on a distribution of threshold voltages of the cells; or determined based on tracking a number of program errors for only a portion of the plurality of cells.

In an embodiment, the number of program loops used to program data for a program level of a plurality of program levels of the NAND flash memory is determined prior to receipt of the write request and based on the distribution of threshold voltages of the cells. In an embodiment, the number of program loops used to program data for a program level of a plurality of program levels of the NAND flash memory is determined based on tracking the number of errors for only a portion of the plurality of cells that are to be programmed to the program level. In an embodiment, the number of program loops used to program the data is to be determined further based on a program slope indicating the amount of change in threshold voltages of the plurality of memory cells due to increasing the program voltage by a particular amount. In an embodiment, the number of program loops used to program the data is to be determined further based on an expanse of the distribution of the threshold voltages of the cells.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
a storage device comprising a NAND flash memory, the storage device to:
 receive a write request from a computing host, the write request to specify data to be written to the NAND flash memory;
 perform a number of program loops to program the data into a plurality of cells of the NAND flash memory, wherein a program loop comprises application of a program voltage to a wordline of the NAND flash memory to change the threshold voltage of at least one cell of the plurality of cells; and
 wherein the number of program loops is to be:
  determined prior to receipt of the write request and based on a distribution of threshold voltages of the cells; or
  determined based on tracking a number of program errors for only a portion of the plurality of cells.

2. The apparatus of claim 1, wherein a number of program loops used to program data to a program level of a plurality of program levels of the NAND flash memory is to be determined prior to receipt of the write request and based on the distribution of threshold voltages of the cells.

3. The apparatus of claim 1, wherein a number of program loops used to program data to a program level of a plurality of program levels of the NAND flash memory is determined based on tracking the number of errors for only a portion of the plurality of cells that are to be programmed to the program level.

4. The apparatus of claim 1, wherein the number of program loops is to be determined based further on a program slope indicating the amount of change in threshold voltages of the plurality of cells when a program voltage is increased by a particular amount.

5. The apparatus of claim 1, wherein the number of program loops is to be determined based further on an expanse of the distribution of the threshold voltages of the cells.

6. The apparatus of claim 1, wherein the number of program loops is set based on a stop verify loop count for a last program level, the storage device to stop application of a program verify voltage when a program loop count exceeds the stop verify loop count.

7. The apparatus of claim 1, the storage device further to calculate a start verify loop count and a stop verify loop count for a program level based on the distribution of the threshold voltages of the cells, a program slope, at least one program verify voltage, and a program voltage step, the storage device to apply a program verify voltage when a program loop count reaches the start verify loop count and to stop application of the program verify voltage when the program loop count exceeds the stop verify loop count.

8. The apparatus of claim 1, the storage device further to track errors for cells of alternating bitlines to determine the number of program loops.

9. The apparatus of claim 1, the storage device further to track errors for one out of every N adjacent cells of the plurality of cells to determine the number of program loops, where N is a positive integer greater than one.

10. The apparatus of claim 1, wherein the cells of the portion of the plurality of cells for which the number of errors are to be tracked are randomly distributed among the plurality of cells.

11. A method comprising:
receiving a write request from a computing host, the write request to specify data to be written to a NAND flash memory;
performing a number of program loops to program the data into a plurality of cells of the NAND flash memory, wherein a program loop comprises application of a program voltage to a wordline of the memory to change the threshold voltage of at least one cell of the plurality of cells; and
wherein the number of program loops is:
 determined prior to receipt of the write request and based on a distribution of threshold voltages of the cells; or
 determined based on tracking a number of program errors for only a portion of the plurality of cells.

12. The method of claim 11, wherein a number of program loops used to program data to a program level of a plurality of program levels of the NAND flash memory is determined prior to receipt of the write request and based on the distribution of threshold voltages of the cells.

13. The method of claim 11, wherein a number of program loops used to program data to a program level of a plurality of program levels of the NAND flash memory is determined based on tracking the number of errors for only a portion of the plurality of cells that are to be programmed to the program level.

14. The method of claim 11, wherein the number of program loops is determined further based on a program slope indicating the amount of change in threshold voltages of the plurality of cells when a program voltage is increased by a particular amount.

15. The method of claim 11, wherein the number of program loops is determined based further on an expanse of the distribution of the threshold voltages of the cells.

16. A system comprising:
a processor to send a write request to a storage device; and
a storage device comprising:

a NAND flash memory; and a storage device controller to:

receive the write request from the processor, the write request to specify data to be written to the NAND flash memory;

perform a number of program loops to program the data into a plurality of cells of the NAND flash memory, wherein a program loop comprises application of a program voltage to a wordline of the memory to change the threshold voltage of at least one cell of the plurality of cells; and wherein the number of program loops is to be:

determined prior to receipt of the write request and based on a distribution of threshold voltages of the cells; or determined based on tracking a number of program errors for only a portion of the plurality of cells.

17. The system of claim 16, wherein a number of program loops used to program data to a program level of a plurality of program levels of the NAND flash memory is to be determined prior to receipt of the write request and based on the distribution of threshold voltages of the cells.

18. The system of claim 16, wherein a number of program loops used to program data to a program level of a plurality of program levels of the NAND flash memory is determined based on tracking the number of errors for only a portion of the plurality of cells that are to be programmed to the program level.

19. The system of claim 16, wherein the number of program loops is to be determined based further on a program slope indicating the amount of change in threshold voltages of the plurality of memory cells when a program voltage is increased by a particular amount.

20. The system of claim 16, further comprising one or more of: a battery communicatively coupled to the processor, a display communicatively coupled to the processor, or a network interface communicatively coupled to the processor.

* * * * *